United States Patent
Grodzki

(10) Patent No.: US 10,317,486 B2
(45) Date of Patent: Jun. 11, 2019

(54) METHOD AND MAGNETIC RESONANCE APPARATUS FOR DETERMINING A MINIMIZED ECHO TIME

(71) Applicant: Siemens Aktiengesellschaft, Munich (DE)

(72) Inventor: David Grodzki, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 824 days.

(21) Appl. No.: 14/884,809

(22) Filed: Oct. 16, 2015

(65) Prior Publication Data

US 2016/0109543 A1 Apr. 21, 2016

(30) Foreign Application Priority Data

Oct. 16, 2014 (DE) .................. 10 2014 221 017

(51) Int. Cl.
*G01R 33/48* (2006.01)
*G01R 33/54* (2006.01)

(52) U.S. Cl.
CPC ........ *G01R 33/4816* (2013.01); *G01R 33/482* (2013.01); *G01R 33/543* (2013.01)

(58) Field of Classification Search
CPC .. G01R 33/50; G01R 33/561; G01R 33/5615; G01R 33/543; G01R 33/482; G01R 33/4816

See application file for complete search history.

(56) References Cited

U.S. PATENT DOCUMENTS

| | | | |
|---|---|---|---|
| 4,641,095 A | 2/1987 | Riederer | |
| 2011/0215804 A1* | 9/2011 | Deimling | G01R 33/4816 324/307 |
| 2012/0081113 A1* | 4/2012 | Grodzki | G01R 33/4816 324/309 |

OTHER PUBLICATIONS

Du et al., "Ultrashort Echo Time Imaging With Bicomponent Analysis," Magnetic Resonance in Medicine, vol. 67, pp. 645-649 (2012).
Qian et al., "Multicomponent T2 Mapping of Knee Cartilage: Technical Feasibility Ex Vivo," Magnetic Resonance in Medicine, vol. 64, pp. 1427-1432 (2010).

* cited by examiner

*Primary Examiner* — Son T Le
(74) *Attorney, Agent, or Firm* — Schiff Hardin LLP

(57) ABSTRACT

In a method for determining a minimum possible echo time for a radio-frequency coil used in a magnetic resonance scanner, magnetic resonance signals are acquired with the radio-frequency coil in a magnetic resonance measurement of a free induction decay at fixed time intervals, the minimum possible echo time being determined by evaluating the time series of magnetic resonance signals as the instant from which an exponential signal decay was measured.

15 Claims, 1 Drawing Sheet

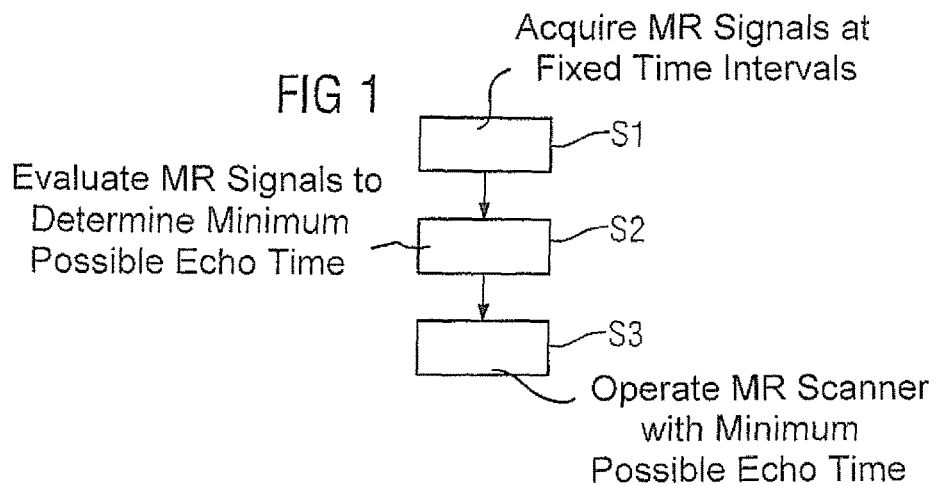
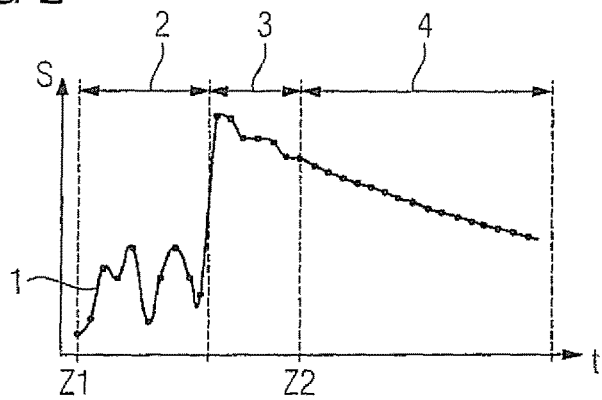
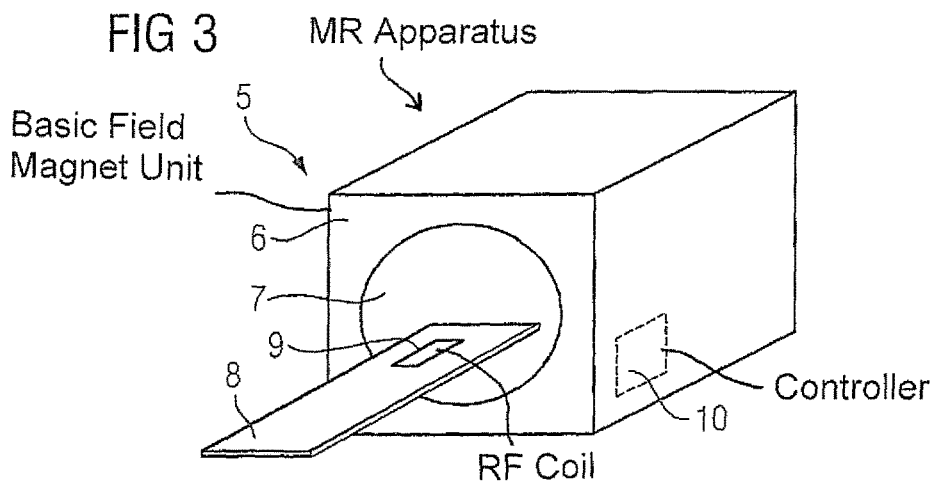

METHOD AND MAGNETIC RESONANCE APPARATUS FOR DETERMINING A MINIMIZED ECHO TIME

BACKGROUND OF THE INVENTION

Field of the Invention

The invention concerns a method for determining an echo time that is as minimum as possible for a radio-frequency coil used in a scanner of a magnetic resonance apparatus, and a magnetic resonance apparatus for implementing such a method.

Description of the Prior Art

The advantages of magnetic resonance sequences with "ultrashort" echo times (TE) are widely discussed. Ultrashort echo times are understood in the art as meaning echo times that are shorter than 500 µs. Magnetic resonance sequences with ultrashort echo times open new potential applications for magnetic resonance imaging, since they also enable magnetic resonance signals of substances that have very short T2 or T2* relaxation times to be measured and displayed. For example, bones, tendons, ligaments, teeth, lung tissue, etc., can be visualized. These cannot be captured with conventional magnetic resonance sequences that usually make use of an echo time of significantly more than one millisecond, so that the magnetic resonance signal of these materials/substances has already decayed at this point in time. Besides the display of tendons, ligaments and bones in orthopedics, magnetic resonance sequences with ultrashort echo times are also employed for creating a µ map for the MR/PET attenuation correction in combined MR/PET imaging devices.

Typical examples of magnetic resonance sequences with ultrashort echo times are the UTE sequence ("ultrashort TE"), the PETRA sequence ("Pointwise Encoding Time reduction with Radial Acquisition") and the zTE sequence ("zero TE"). In all these magnetic resonance sequences, the minimum possible echo time is dictated by the time that the hardware requires to switch between transmit and receive operation, called the dead time $T_{dead}$. This is because the radio-frequency coils must be detuned when the excitation pulse is emitted and this detuning must first be deactivated again. In known standard, clinical radio-frequency coils the dead time is about 40 µs. Since the spins effectively relax from the midpoint of the excitation pulse, the minimum possible echo time is obtained by adding half the duration of the excitation pulse to the dead time. If the duration of the excitation pulse is 60 µs, for example, and the dead time is 40 µs, the minimum possible echo time is $TE_{min}$=70 µs.

The dead time can vary from one magnetic resonance device to another, as well as from one radio-frequency coil to another. It can also occur that radio-frequency coils can also work with dead times significantly less than the nominal dead time that is actually specified. Dependencies on the flip angle that is employed are also possible. However, if the user chooses an echo time that is too short, the first points of the readout operation are not measured correctly, resulting in image artifacts. To prevent this, it is known to permit only one single minimum possible echo time, which can be set, in hardcoded form, for all radio-frequency coils.

However, this means that in most cases the actual possible minimum echo time cannot be set, resulting in a poorer signal-to-noise ratio for substances with an extremely short T2 relaxation time, as well as a longer measurement time for example in the PETRA sequence, since in that case a larger central portion of k-space has to be captured in Cartesian form. By providing minimum possible echo times that should work with a sufficient buffer for all radio-frequency coils, it may nevertheless occur that when using older radio-frequency coils the minimum possible echo time is not long enough to prevent image artifacts.

SUMMARY OF THE INVENTION

An object of the invention is to allow the possibility for implementing shorter possible echo times for particular radio-frequency coils, in magnetic resonance sequences with ultrashort echo times.

To achieve this object in accordance with the invention, in a method of the type initially described, is inventively provided, in which magnetic resonance signals are recorded with the radio-frequency coil in a magnetic resonance measurement of a free induction decay at fixed time intervals, the minimum possible echo time is determined by evaluating the time series of magnetic resonance signals based on the point in time from which an exponential signal decay was measured.

The invention therefore is an automatic method for determining the minimum possible echo time for an imminent data recording with a magnetic resonance sequence wherein, at the start of the data recording or in a preliminary measurement ahead of the data recording, a free induction decay (FID) is measured and is examined for the point in time at which the expected exponential signal decay occurs. This instant, as from which the expected exponential signal decay arises, corresponds to the sought minimum possible echo time. In this situation, the recording of the magnetic resonance signals of the FID at fixed time intervals preferably starts immediately after the termination of the preceding excitation pulse, in order to capture even extremely short dead times of the radio-frequency coil which, as described, occur as a result of the deactivation of the detuning. However, it is also conceivable, after a predetermined portion of a nominal dead time of the coil after the excitation pulse, to start the recording of magnetic resonance signals at fixed time intervals. It is possible, for example, to use two-thirds of the specified nominal dead time of the radio-frequency coil for that purpose. To obtain a sufficient resolution with respect to the minimum possible echo time, the fixed time interval is shorter than 6 µs, the fixed time interval preferably being selected as 1 to 3 µs, for example 2 µs. With shorter fixed time intervals it should be noted that the magnetic resonance signal recorded is noisier overall.

Based on the magnetic resonance signal measured in the free induction decay (FID), the minimum possible echo time ($TE_{min}$) should now be determined by evaluation, the measurement instant being sought from which the signal profile reflects the expected exponential decay. This also corresponds to the instant from which the radio-frequency coil detects (receives) reliable measured values. In particular, a comparison is made of magnetic resonance signals recorded at adjacent instants, in particular to determine a decay parameter, which is examined at in greater detail below.

In this way the actual minimum possible echo time can be determined automatically for every radio-frequency coil in every magnetic resonance scanner, and in the following this can be employed to arrive at an optimum signal yield of substances with an ultrashort T2 relaxation time, and/or a minimum measurement time for the PETRA magnetic resonance sequence.

In a preferred embodiment of the invention, a decay parameter, in particular a relaxation time, describing the exponential decay, is determined from a pair of magnetic resonance signals recorded at adjacent instants, and an exponential decay is established based on a comparison of the decay parameters of at least two, preferably at least three, pairs that are adjacent in time. Expediently the exponential decay can be established if the decay parameters of the pairs adjacent in time match within a tolerance interval. In a specific embodiment of the invention in this context, to establish the exponential decay the decay parameters of the pairs adjacent in time may maximally deviate from one another by a predefined percentage, in particular 15-25%, preferably 20%.

In a specific embodiment of the invention, the decay parameter describing an exponential decay is determined from the recorded magnetic resonance signals of two instants that are adjacent in time. The expected profile of the magnetic resonance signal, S(t), is expressed by $$S(t)=S_0 * \exp(-t/T2).$$

Here T2 ultimately describes the T2 relaxation time of the free induction decay. It follows from this however that the signal theoretically decays by $$S_{i+1}=S_i * \exp(-dt/T2)$$

between two consecutive measurement instants i and i+1 with the time interval dt, so that a resulting effective T2 between the two instants is $$T2=dt/(\ln(S_i/S_{i+1})).$$

In accordance with the invention, the magnetic resonance signals of such pairs of instants adjacent in time are compared with one another until the T2 values between the pairs are constant, in other words until a free induction decay (FID) is actually measured. A criterion that can be selected here is for a T2 value with a change of less than 20% to be determined over at least two, but preferably at least three, such pairs, preferably during an evaluation of all magnetic resonance signals have already been recorded. This is to make a safety check as to whether the T2 value or in general the decay parameter then remains constant over the measurement time (within the tolerance interval). The instant from which the decay parameter, in particular the T2 value described, remains constant is the instant from which it is actually possible to measure, i.e. the minimum possible dead time is determined as a function of the first measurement instant at which the exponential decay was established. If this instant is designated as Z2, this therefore gives the minimum possible echo time at $$TE_{min}=\text{(duration of the excitation pulse)}/2+Z2.$$

An advantageous application of the inventive method is in the PETRA magnetic resonance sequence or generally in magnetic resonance sequences in which a central portion of k-space is scanned in Cartesian form by individual measurements and the external portions of k-space are scanned radially. When using such a magnetic resonance sequence, at the start of the overall measurement an individual measurement of the center of k-space is made as a magnetic resonance measurement for recording the magnetic resonance signals, after which the minimum possible echo time is determined based on this individual measurement of the center of k-space. From this, the extent of the portion to be measured in Cartesian form in the following individual measurements can be determined when using the minimum possible echo time for the radial scanning operations still to be performed. The magnetic resonance protocol is then accordingly set dynamically on the basis of this first individual measurement, which means the minimum possible echo time is also actually employed at least for the radial scanning. This embodiment of the inventive method exploits the fact that in such magnetic resonance sequences, in particular the PETRA sequence, the center of k-space must be measured (filled) in any case, but simultaneously a free induction decay (FID) is definitely present therein, so that this individual measurement can be used in Cartesian scanning to record the magnetic resonance signals on which the determination of the minimum possible echo time is based, but simultaneously the magnetic resonance signals present from the center of k-space are already available as the result of the overall measurement. According to the invention, the inventive procedure for determining the minimum possible echo time is therefore applied to the center of k-space, so that the minimum possible echo time can be determined in the very first repetition of the magnetic resonance sequence. Once this is known, it is possible to derive from it how large the portion to be measured in Cartesian form is, if this minimum possible echo time is used for the radial scanning, so that the magnetic resonance sequence can be dynamically set to the new information, and consequently the profile of k-space trajectories, the repetition quantity, etc. are first calculated therefrom. This ensures a minimum measurement time for the magnetic resonance sequence and an optimum measurement.

The procedure can also be employed with other magnetic resonance sequences. It is possible in the magnetic resonance measurement to immediately precede a data recording with a magnetic resonance sequence, with the echo time to be used during the data recording with the magnetic resonance sequence being dynamically set as the minimum possible echo time. In this case there is a preliminary measurement, from which the minimum possible echo time can be derived for the data recording that now actually follows. Such an additional repetition or preliminary measurement lasts only a few milliseconds and hence has only a negligible impact on the overall measurement time.

It is also possible for the determined minimum possible echo time to be used as a lower limit for an adjustable echo time in a user interface for the definition of a magnetic resonance protocol. Consequently, the magnetic resonance measurement is always performed to determine the minimum possible echo time if a magnetic resonance protocol is to be set, in order to adjust the restrictions in the user interface. It is nevertheless preferred, as described, to employ the minimum possible echo time for the dynamic configuration of the magnetic resonance sequences during the data recording. It is possible, for example, to enable this in a user interface by a "minimum TE" option, instead of selecting a specific echo time.

The invention also concerns a magnetic resonance apparatus having a controller configured to implement the inventive method. All embodiments relating to the inventive method apply analogously to the inventive magnetic resonance apparatus, with which the advantages described above can consequently also be achieved.

The magnetic resonance apparatus can also have the above-described radio-frequency coil, if this is not separately provided and is only added for the measurement.

BRIEF DESCRIPTION OF THE DRAWINGS

FIG. 1 is a flowchart of an exemplary embodiment of the inventive method.

FIG. 2 shows an exemplary profile of a measured magnetic resonance signal.

FIG. 3 shows an inventive magnetic resonance apparatus.

DESCRIPTION OF THE PREFERRED EMBODIMENTS

FIG. 1 shows a basic flowchart of exemplary embodiments of the inventive method. In a step 1 a magnetic resonance measurement is performed, a free induction decay being recorded in a single repetition with a radio-frequency coil, by measuring magnetic resonance signals at fixed time intervals, in this case of 2 μs. In this exemplary embodiment the magnetic resonance measurement starts immediately after the termination of the excitation pulse which precedes it.

In step S2 the time series of magnetic resonance signals is evaluated, in order to determine a minimum possible echo time in the combination of magnetic resonance device used and radio-frequency coil for the data recording to be performed. To this end the measurement instant (point in time) should be determined, from which an exponential signal decay was measured.

One possible profile 1 of the measured magnetic resonance signal S of a free induction decay with respect to time t is shown in FIG. 2. The points along the profile 1 can here correspond to measurement instants.

The measurement begins at an instant Z1, immediately after the termination of the excitation pulse. The radio-frequency coil is detuned at this instant, since the change-over procedure to terminate the detuning is running (dead time). Consequently at an instant 2 at which the radio-frequency coil is not yet ready more or fewer noise level values are recorded as a magnetic resonance signal. At an instant 3 the radio-frequency coil is again in principle capable of receiving, so that actual signal values of the FID are measured, but these are in this case overlaid by overshoots. Only from the instant Z2 is the expected exponential decay measured in time period 4.

In order now to be able to locate (identify) the instant Z2, and consequently the start of the measurement of the exponential decay, pairs of magnetic resonance signals recorded at measurement instants adjacent in time are in each case considered. For this purpose, a decay parameter, here the T2 value specified above, is determined, on the assumption that an exponential decay is already involved. Now all that needs to be established is the instant from which the T2 value remains essentially constant, i.e. the exponential decay arises, so that the T2 values of consecutive pairs are checked to ascertain whether the decay parameters only deviate from one another within a tolerance interval, in this case whether a change of less than 20% occurs. This constant must exist for at least three, preferably more, consecutive pairs, so that the time period 4 of the exponential decay is detected. The first measurement instant, from which this T2 value is determined, is the instant Z2, at which a measurement can actually be made. The minimum possible echo time is consequently obtained from the instant Z2 after the end of the excitation pulse and half the duration of the excitation pulse.

In step S3 according to FIG. 1, the minimum possible echo time is then preferably actually used for the data recording if it is not to be used for entering a limit for the selectable echo time into a user interface, a distinction ultimately already having to be made with respect to the step S1.

If the data recording is made with a magnetic resonance sequence in which a central region of k-space is scanned in Cartesian form, but the peripheral regions of k-space are filled with data by radial scanning, the method described in steps S1 to S3 is expediently performed as part of the data recording with the magnetic resonance sequence. To this end, initially an individual measurement (scanned in Cartesian form) of the k-space center is performed, where a free induction decay is measured, so that this first repetition of the data recording with the magnetic resonance sequence can be used as a magnetic resonance measurement to record the magnetic resonance signals in step S1. Furthermore, the k-space center (k=0) must be scanned (filled with data) in any case, so that the magnetic resonance signals also serve as magnetic resonance data in the result of the data recording with the magnetic resonance sequence. Since then the steps S2 and S3 are performed, and consequently a minimum possible echo time is available, this is used in the magnetic resonance protocol, which is dynamically set, as an echo time for the radial scanning, from which the central region emerges that still has to be scanned in Cartesian form, and compared to longer echo times in the radial scanning is reduced, so that the dynamic setting of the magnetic resonance protocol after the first repetition also reduces the number of data entry points of the central region to be scanned in Cartesian form in individual measurements, and consequently expedites the data recording overall, since few repetitions are necessary. The actual minimum possible echo time is used, rather than a predefined echo time that, if necessary, has a buffer (tolerance).

In other magnetic resonance sequences the magnetic resonance measurement of step S1 and the performance of steps S2 and S3 can take place as an additional repetition before the data recording as a preliminary measurement, which can be performed extremely quickly in a matter of milliseconds. The result can likewise be used to adjust the echo times to be used during the data recording with the magnetic resonance sequence to the minimum possible echo time, so that an optimum signal yield of materials with an ultrashort T2 relaxation time is achieved.

FIG. 3 schematically shows an inventive magnetic resonance apparatus 5. This has, as is known in principle, a basic field magnet unit 6 that defines a patient aperture 7. As is known in principle but not shown here in greater detail, a radio-frequency coil arrangement and a gradient coil arrangement are provided in the basic field magnet unit 6, so as to form a magnetic resonance scanner. A patient bed 8 can be used to introduce a patient into the patient aperture 7 for the examination. Shown on the patient bed 8 is a radio-frequency coil 9, here a local coil, with which the data recording with a magnetic resonance sequence should take place with an ultrashort echo time. To be able to determine the minimum possible echo time for the radio-frequency coil 9 in the magnetic resonance apparatus 5 for the data recording, a controller 10 of the magnetic resonance apparatus 5 is configured for the performance of the inventive method. In particular, with the controller 10, in particular a recording unit thereof, it is possible to actuate the remaining components of the magnetic resonance apparatus 5 to acquire the magnetic resonance signals in step S1; a calculation unit can determine the minimum possible echo time in step S2 and a protocol adjustment unit can in step S3 set the magnetic resonance protocols for data recording, in particular dynamically during the measurement in the PETRA sequence.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a minimum possible echo time in a radio-frequency coil in a magnetic resonance scanner, comprising:

operating the magnetic resonance scanner to detect magnetic resonance signals with said radio-frequency coil in a magnetic resonance measurement of free induction decay at fixed time intervals;

providing said magnetic resonance signals to a processor and, in said processor, automatically evaluating said magnetic resonance signals detected at said fixed time intervals to determine the minimum possible echo time as a point in time from which an exponential signal decay was detected by said radio-frequency coil;

in said processor, generating a control protocol, that embodies said minimum possible echo time, and emitting said control protocol as an electrical control signal to said magnetic resonance scanner; and with said electrical control signal, operating the magnetic resonance scanner to acquire said magnetic resonance signals at said minimum possible echo time, and making the acquired magnetic resonance signals available in electronic form from a subject.

2. A method as claimed in claim 1 comprising starting said magnetic resonance measurement immediately after termination of an excitation pulse that produces said free induction decay.

3. A method as claimed in claim 1 comprising starting said magnetic resonance measurement after a predetermined portion of a nominal dead time of said radio-frequency coil following an excitation pulse that produces said free induction decay.

4. A method as claimed in claim 1 comprising determining said minimum possible echo time by evaluating a decay parameter determined from a pair of said magnetic resonance signals acquired respectively at adjacent points in time with at least two decay parameters respectively for said adjacent points in time establishing said exponential signal decay.

5. A method as claimed in claim 4 comprising using a relaxation time of nuclear spins of a subject as said decay parameter.

6. A method as claimed in claim 4 comprising establishing said exponential signal decay when said decay parameters at said adjacent points in time match within a predetermined tolerance range.

7. A method as claimed in claim 6 comprising setting said tolerance range as a predetermined percentage of respective values of said decay parameters at said respective points in time.

8. A method as claimed in claim 7 wherein said tolerance range is between 15% and 25%.

9. A method as claimed in claim 1 comprising establishing a minimum possible dead time of said radio-frequency coil dependent on a first measurement point in time at which said exponential signal decay is established.

10. A method as claimed in claim 1 comprising, in said control protocol, entering acquired magnetic resonance data along a Cartesian trajectory into a central portion of a memory organized as k-space, with a plurality of individual measurements, and entering said magnetic resonance data into a peripheral portion of k-space along a radial trajectory and, at a start of said control protocol, making an individual data entry at a center of k-space and thereafter determining said minimum possible echo time based on said individual data at said center of k-space, and using said minimum possible echo time to determine an extent of k-space in which data will be entered along said Cartesian trajectory and in which data will be entered along said radial trajectory, respectively.

11. A method as claimed in claim 1 comprising configuring said control protocol so as to have an echo time that is set as said minimum possible echo time.

12. A method as claimed in claim 1 comprising determining said minimum possible echo time as a lower limit of an adjustable echo time via a user interface of said processor.

13. A magnetic resonance apparatus, comprising:

a magnetic resonance scanner;

a control computer configured to operate the magnetic resonance scanner to detect magnetic resonance signals with said radio-frequency coil in a magnetic resonance measurement of free induction decay at fixed time intervals;

a processor provided with said magnetic resonance signals, said processor being configured to automatically evaluate said magnetic resonance signals detected at said fixed time intervals to determine the minimum possible echo time as a point in time from which an exponential signal decay was detected by said radio-frequency coil;

said processor being configured to generate a control protocol, that embodies said minimum possible echo time, and to emit said control protocol as an electrical control signal to said control signal; and said processor being configured to operate the magnetic resonance scanner to acquire said magnetic resonance signals at said minimum possible echo time, and making the acquired magnetic resonance signals available in electronic form from a subject.

14. An apparatus as claimed in claim 13 wherein said processor is configured to reconstruct image data from the data file containing the MR signals, and to display said image data as a depicted image of the subject.

15. A method as claimed in claim 1 comprising, in said processor, reconstructing image data from the MR signals contained in said data file, and displaying said image data as a depicted image of the subject.

* * * * *